United States Patent
Artico et al.

(10) Patent No.: US 10,877,847 B2
(45) Date of Patent: Dec. 29, 2020

(54) USING ACCELERATORS FOR DISTRIBUTED DATA COMPRESSION AND DECOMPRESSION TO IMPROVE CHECKPOINT / RESTART TIMES

(71) Applicant: INTERNATIONAL BUSINESS MACHINES CORPORATION, Armonk, NY (US)

(72) Inventors: Fausto Artico, Veneto (IT); Bryan S. Rosenburg, Cortlandt Manor, NY (US)

(73) Assignee: International Business Machines Corporation, Armonk, NY (US)

(*) Notice: Subject to any disclaimer, the term of this patent is extended or adjusted under 35 U.S.C. 154(b) by 128 days.

(21) Appl. No.: 16/155,830

(22) Filed: Oct. 9, 2018

(65) Prior Publication Data

US 2020/0110670 A1    Apr. 9, 2020

(51) Int. Cl.
*G06F 11/14* (2006.01)
*G06F 11/20* (2006.01)
(Continued)

(52) U.S. Cl.
CPC ........ *G06F 11/1451* (2013.01); *G06F 3/0616* (2013.01); *G06F 9/461* (2013.01);
(Continued)

(58) Field of Classification Search
CPC ............ G06F 11/1438; G06F 11/1471; G06F 11/1474; G06F 11/1484; G06F 11/0751; G06F 11/0772; G06F 11/2025
See application file for complete search history.

(56) References Cited

U.S. PATENT DOCUMENTS

| 7,779,298 B2 | 8/2010 | Challenger et al. |
| 7,873,869 B2 * | 1/2011 | Darrington ......... G06F 11/1438 714/15 |

(Continued)

OTHER PUBLICATIONS

Jia et al., Data Storage Optimization of Application-Level Checkpointing on Heterogeneous Systems, IEEE Conference Anthology, Jan. 2013, p. 1-6 https://ieeexplore.ieee.org/document/6784773/.

(Continued)

*Primary Examiner* — Nadeem Iqbal
(74) *Attorney, Agent, or Firm* — Daniel Morris; Otterstedt, Wallace & Kammer, LLP

(57) ABSTRACT

An illustrative embodiment includes a method for checkpointing and restarting an application executing at least in part on one or more central processing units coupled to one or more hardware accelerators. The method comprises checkpointing the application at least in part by: transferring checkpoint data of the application to the one or more hardware accelerators; performing distributed compression of the application checkpoint data at least in part using the one or more hardware accelerators; and writing the compressed application checkpoint data to a storage device. The method further comprises restarting the application at least in part by: reading the compressed application checkpoint data from the storage device; transferring the compressed checkpoint data to one or more hardware accelerators; and performing distributed decompression of the application checkpoint data at least in part using said one or more hardware accelerators.

20 Claims, 8 Drawing Sheets

(51) Int. Cl.
  *G06F 3/06* (2006.01)
  *H03M 7/30* (2006.01)
  *G06F 9/46* (2006.01)
(52) U.S. Cl.
  CPC ........ *G06F 11/1438* (2013.01); *G06F 11/202* (2013.01); *H03M 7/30* (2013.01)

(56) References Cited

U.S. PATENT DOCUMENTS

| | | | |
|---|---|---|---|
| 8,108,662 B2 | 1/2012 | Darrington et al. | |
| 9,104,617 B2* | 8/2015 | Darrington | G06F 11/1438 |
| 9,280,383 B2* | 3/2016 | Cher | G06F 9/4818 |
| 9,319,063 B2* | 4/2016 | Wegener | H03M 7/30 |
| 9,792,182 B2* | 10/2017 | Kannan | G06F 11/1438 |
| 9,910,734 B2* | 3/2018 | Chai | G06F 11/1415 |
| 10,275,851 B1* | 4/2019 | Zhao | G09G 5/006 |
| 2004/0028141 A1 | 2/2004 | Hsiun et al. | |
| 2008/0056253 A1 | 3/2008 | Minami et al. | |
| 2011/0173289 A1 | 7/2011 | Chen et al. | |
| 2011/0219208 A1 | 9/2011 | Assad et al. | |
| 2015/0363225 A1 | 12/2015 | Cher | |
| 2015/0363277 A1 | 12/2015 | Cher | |
| 2016/0124814 A1 | 5/2016 | Joseph et al. | |
| 2019/0324856 A1* | 10/2019 | Zhao | G06F 11/1407 |
| 2020/0026603 A1* | 1/2020 | Harwood | H04L 67/10 |

OTHER PUBLICATIONS

Zeng et al., An MPI-CUDA implementation for the compression of DEM, 2016 IEEE International Geoscience and Remote Sensing Symposium (IGARSS), Jul. 2016, p. 2552-2555 https://ieeexplore.ieee.org/document/7729659/.
Vijaykumar et al., A Case for Core-Assisted Bottleneck Acceleration in GPUs: Enabling Flexible Data Compression with Assist Warps, 2015 ACM/IEEE 42nd Annual International Symposium on Computer Architecture (ISCA), Jun. 2015, p. 41-53 https://ieeexplore.ieee.org/document/7284054/.
Zhou et al., A Parallel High Speed Lossless Data Compression Algorithm in Large-Scale Wireless Sensor Network, International Journal of Distributed Sensor Networks, v. 11, n. 6, Jun. 2015, Article ID 795353, 12 pages.
Cloud et al., Accelerating Lossless Data Compression with Graphics Processing Units, Inquiro, v. 3, 2009, p. 24-27.
Cloud et al., Accelerating Lossless Data Compression with GPUs, 2011, https://arxiv.org/pdf/1107.1525.pdf.
Ozsoy et al., CULZSS: LZSS Lossless Data Compression on CUDA, 2011 IEEE International Conference on Cluster Computing, Sep. 2011, p. 403-411 https://ieeexplore.ieee.org/document/6061071/.
Pekhimenkoy et al., Energy-Efficient Data Compression for GPU Memory Systems, ACM Student Research Competition (SRC), 20th International Conference on Architectural Support for Programming Languages and Operating Systems (ASPLOS), Mar. 2015, 2 pages.

O'Neil et al., Floating-Point Data Compression at 75 Gb/s on a GPU, Proceedings of the Fourth Workshop on General Purpose Processing on Graphics Processing Units (GPGPU-4), Article 7, Mar. 2011 https://dl.acm.org/citation.cfm?id=1964189.
Guthe et al., GPU-Based Lossless Volume Data Compression, 2016 3DTV—Conference: The True Vision—Capture, Transmission and Display of 3D Video (3DTV-CON), Jul. 2016, p. 1-4 https://ieeexplore.ieee.org/document/7548892/.
Treib, GPU-Based Compression for Large-Scale Visualization, Dr. rer. nat. Dissertation, Technische Universitat Munchen, 2014, p. 1-173, http://mediatum.ub.tum.de/doc/1190931/939759.pdf.
Lee et al., Improving Energy Efficiency of GPUs through Data Compression and Compressed Execution, IEEE Transactions on Computers, v. 66, n. 5, May 2017, p. 834-847 https://ieeexplore.ieee.org/document/7600453/.
Shafiee et al., MemZip: Exploring Unconventional Benefits from Memory Compression, 2014 IEEE 20th International Symposium on High Performance Computer Architecture (HPCA), Feb. 2014, p. 638-649. https://ieeexplore.ieee.org/document/6835972/.
Patel et al., Parallel Lossless Data Compression on the GPU, 2012 Innovative Parallel Computing (InPar), May 2012, p. 1-9 https://ieeexplore.ieee.org/document/6339599/.
Patel, Parallel Lossless Data Compression on the GPU, Thesis for Master of Science in Electrical and Computer Engineering, University of California Davis, 2012, p. 1-39 http://www.iday.ucdavis.edu/func/return_pdf?pub_id=1111.
Ibtesham et al., A checkpoint compression study for high-performance computing systems, International Journal of High Performance Computing Applications, v. 29, n. 4, 2015, p. 387-402 http://journals.sagepub.com/doi/abs/10.1177/1094342015570921.
Takizawa et al., CheCUDA: A Checkpoint/Restart Tool for CUDA Applications, 2009 International Conference on Parallel and Distributed Computing, Applications and Technologies, Dec. 2009, p. 408-413 https://ieeexplore.ieee.org/document/5372771/.
Nukuda et al., NVCR: A Transparent Checkpoint-Restart Library for NVIDIA CUDA, 2011 IEEE International Symposium on Parallel and Distributed Processing Workshops and Phd Forum, May 2011, p. 104-113 https://ieeexplore.ieee.org/document/6008825/.
Zhang et al., A Checkpoint/Restart Scheme for CUDA Applications with Complex Memory Hierarchy, 2013 14th ACIS International Conference on Software Engineering, Artificial Intelligence, Networking and Parallel/Distributed Computing, Jul. 2013, p. 247-252 https://ieeexplore.ieee.org/document/6598473/.
Jiang et al, A Checkpoint/Restart Scheme for CUDA Programs with Complex Computation States, International Journal of Networked and Distributed Computing, v. 1, n. 4, Nov. 2013, p. 196-212.
PCI-SIG, PCI Express® Base Specification Revision 3.0, Nov. 10, 2010, 860 pages.
Harris, How NVLink Will Enable Faster, Easier Multi-GPU Computing, Nov. 14, 2014, 3 pages, https://devblogs.nvidia.com/how-nvlink-will-enable-faster-easier-multi-gpu-computing/.
Nyland et al., Inside Pascal, GPU Technology Conference (GTC) Silicon Valley 2016—ID S6176, Apr. 5, 2016, 23 pages, http://on-demand.gputechconf.com/gtc/2016/presentation/s6176-mark-harris-lars-nyland.pdf.

\* cited by examiner

USING ACCELERATORS FOR DISTRIBUTED DATA COMPRESSION AND DECOMPRESSION TO IMPROVE CHECKPOINT / RESTART TIMES

BACKGROUND

The present invention relates to the electrical, electronic and computer arts, and, more particularly, to improvements in high performance computing (HPC).

As the number of HPC nodes necessary for simulations will likely continue to increase, the mean time between failure (MTBF) for future HPC systems will likely decrease, such that Department of Energy (DoE) applications that run even only for a few days may be subject to multiple failures. Checkpoint/restart (CPR) schemes will be increasingly important for improving reliability and throughput for HPC applications. However, CPR schemes generate run-time overhead, e.g., because applications typically do not continue executing during checkpointing. Moreover, the ability to write checkpoints and restart applications is limited by the read/write bandwidth to long term storage devices, such as hard disks. Thus, software solutions are too slow, while the use of dedicated hardware, such as burst buffers (BBs), is expensive—and even expensive hardware solutions fail to offset the huge run-time overhead that CPR schemes can generate.

Compression and decompression codes (CDCs) are usually highly serial and thus are typically highly inefficient even on accelerators, such as graphical processing units (GPUs). Also, the limited bandwidth of connecting links between central processing units (CPUs) and accelerators has caused data movement between accelerators and CPUs to be prohibitive for CDCs. For example, version 3.0 of the Peripheral Component Interconnect Express (PCI-e) standard provides bandwidth of no more than 16 gigabytes per second (GB/s). Moreover, only a very limited number of accelerators could be connected to the same CPU, such that HPC nodes often have at most 1 or 2 accelerators per CPU. Thus, the CPUs of an HPC node, working together, could easily compress and decompress data faster than the accelerators.

SUMMARY

An illustrative embodiment includes a method for checkpointing and restarting an application executing at least in part on one or more central processing units coupled to one or more hardware accelerators. The method comprises checkpointing the application at least in part by: transferring checkpoint data of the application to the one or more hardware accelerators; performing distributed compression of the application checkpoint data at least in part using the one or more hardware accelerators; and writing the compressed application checkpoint data to a storage device. The method further comprises restarting the application at least in part by: reading the compressed application checkpoint data from the storage device; transferring the checkpoint data to one or more hardware accelerators; and performing distributed decompression of the application checkpoint data at least in part using said one or more hardware accelerators.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

These and other features and advantages of the present invention will become apparent from the following detailed description of illustrative embodiments thereof, which is to be read in connection with the accompanying drawings.

DETAILED DESCRIPTION

Although primarily discussed herein with respect to illustrative embodiments including GPUs, one skilled in the art will recognize that principles of the present invention are applicable to other types of hardware accelerators and/or coprocessors, including but not limited to graphical processing units (GPUs), floating-point units (FPUs), physics processing units (PPUs), and/or tensor processing units (TPUs). Such hardware accelerators and/or coprocessors are typically on a different integrated circuit die than the CPU. In some embodiments, a hardware accelerator and/or coprocessor may be implemented as a field-programmable gate array (FPGA), application-specific integrated circuit (ASIC), and/or application-specific instruction set processor (ASIP). Moreover, although primarily discussed herein with respect to image processing, one skilled in the art will recognize that principles of the present invention are applicable to processing of data with any number of dimensions, including but not limited to one-dimensional numeric vectors, two-dimensional graphical images, three-dimensional CAD (computer-aided design) objects, structured or unstructured data, text, audio, video, etc.

Figure 1A:
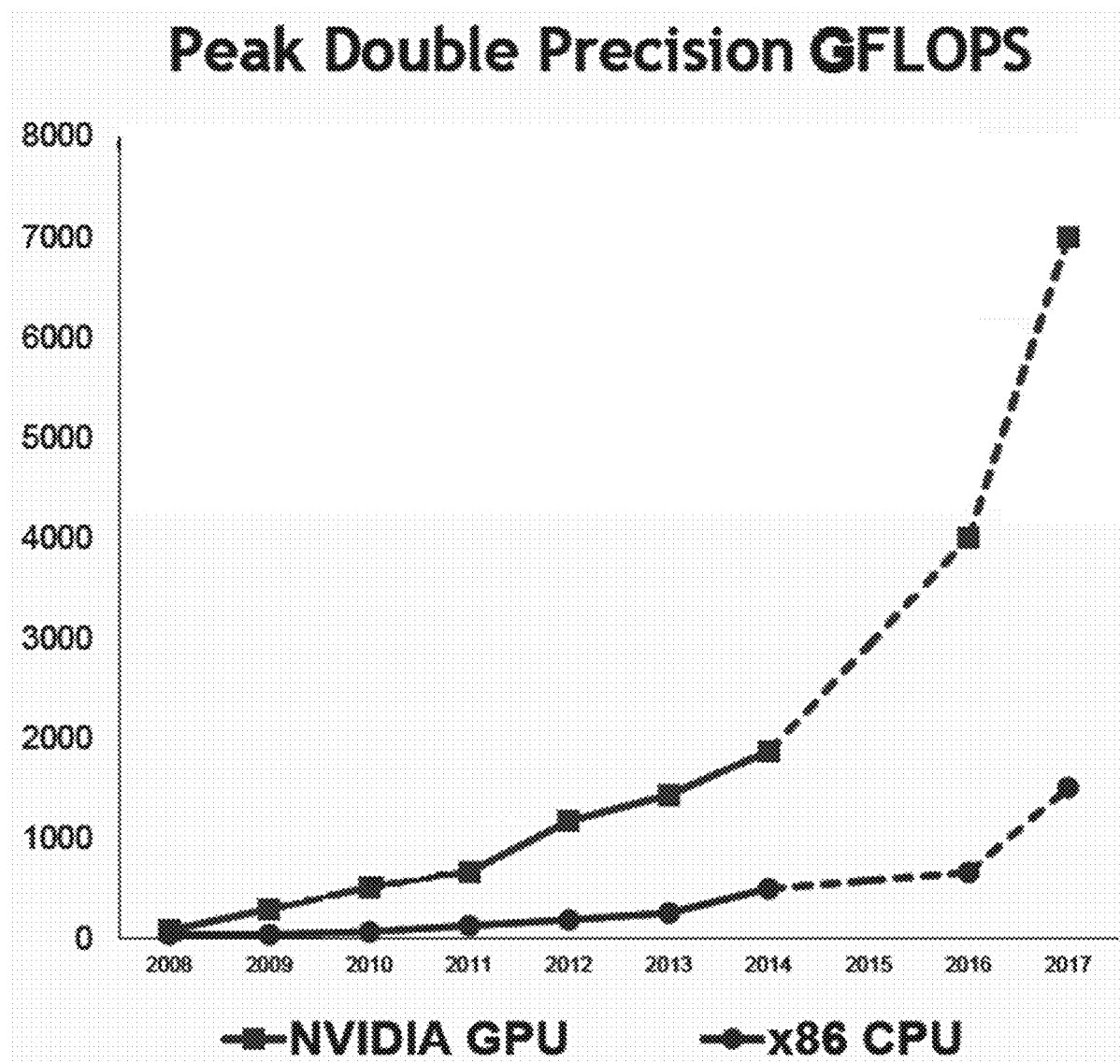
FIG. 1A compares peak double-precision GFLOPS (giga-floating-point-operations per second) between commercially-available Nvidia® GPUs and x86 CPUs in different years.
Figure 1B:
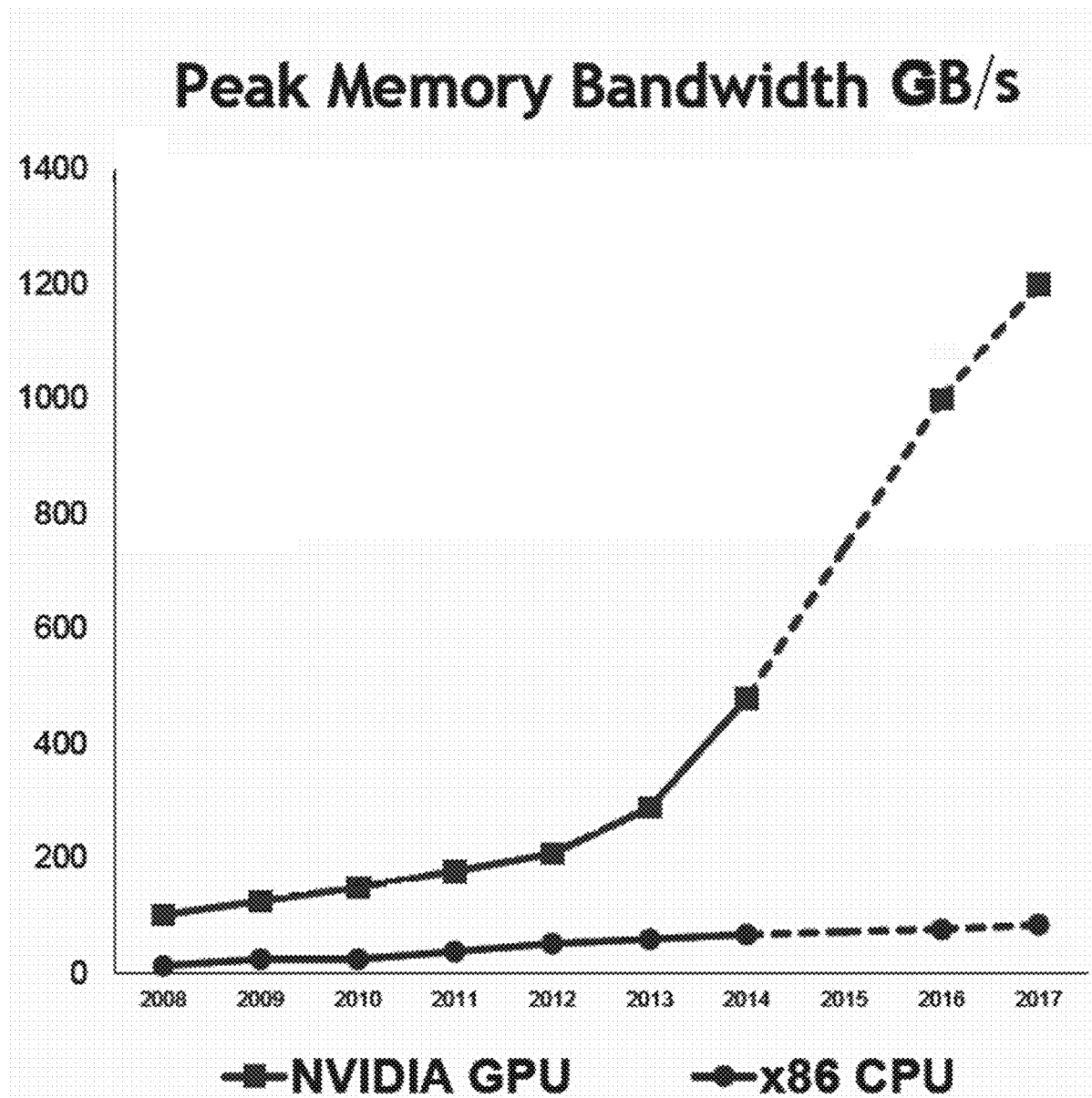
FIG. 1B compares peak memory bandwidth in GB/s (gigabytes per second) between commercially-available Nvidia® GPUs and x86 CPUs in different years.

The computational gap between CPUs and accelerators has been rapidly increasing as shown in FIGS. 1A and 1B. FIG. 1A compares peak double-precision GFLOPS (gigafloating-point-operations per second) between commercially-available Nvidia® GPUs and x86 CPUs in different years, while FIG. 1B compares peak memory bandwidth in GB/s (gigabytes per second) between commercially-available Nvidia® GPUs and x86 CPUs in different years. (Nvidia® is a registered trademark of Nvidia Corporation.) The x86 CPUs (e.g., Nehalem in 2009, Westmere in 2010, Sandy Bridge in 2012, Ivy Bridge in 2013, Haswell in 2014) have provided less than 2,000 double-precision GFLOPS with less than 100 GB/s memory bandwidth.

In 2008, the Nvidia® M1060 GPU offered peak 77.8 double-precision GFLOPS with 102 GB/s memory bandwidth. In 2010, the Nvidia® M2050 GPU offered peak 515.2 double-precision GFLOPS with 148 GB/s memory bandwidth. In 2011, the Nvidia® M2090 GPU offered peak 665.6 double-precision GFLOPS with 178 GB/s memory bandwidth. In 2012, the Nvidia® K20 GPU offered peak 1,175 double-precision GFLOPS with 208 GB/s memory bandwidth. In 2013, the Nvidia® K40 GPU offered peak 1,430 double-precision GFLOPS with 288 GB/s memory bandwidth. In 2014, the Nvidia® K80 GPU offered peak 1,864 double-precision GFLOPS with 480 GB/s memory bandwidth. In 2016, the Nvidia® Pascal GPU offered peak 4,000 double-precision GFLOPS with 1,000 GB/s memory bandwidth. In 2017, the Nvidia® Volta GPU offered peak 7,000 double-precision GFLOPS with 1,200 GB/s memory bandwidth.

Faster links are resulting in smaller transfer time between CPUs and GPUs. For example, the NVLink® standard developed by Nvidia® and IBM® allows for 6 NVLink® connections with a total bandwidth of 120 GB/s between CPU and GPU. (NVLink® is a registered trademark of Nvidia Corporation.) The hardware complexity of HPC nodes is increasing to allow for more than 2 accelerators (e.g., GPUs) per CPU. Despite the low efficiency of serial CDCs on GPUs, the GPUs of a node will be able to perform compression/decompression (CD) faster than the CPUs of the node because of the increasing computational gap between CPUs and accelerators, the presence of faster links between CPUs and accelerators, and the increasing number of GPUs per CPU.

Distributed CDC implementations that use accelerators do not currently exist. However, distributed CD implementations that use accelerators will become faster than CPU CDs. Accordingly, embodiments of the present invention use accelerators to execute distributed compression/decompression. Embodiments of the present invention also use accelerators to speed up CPR such that there is less data to write to the solid state devices, thereby accelerating any software or hardware CPR solution. Thus, embodiments of the present invention can provide a longer life for software CPR schemes, and could potentially avoid the use of expensive CPR hardware solutions. Through the use of accelerators to execute distributed data compression and decompression (CD) to accelerate checkpoint/restart (CPR) schemes, embodiments of the present invention can also advantageously reduce network congestion. In an illustrative embodiment, the accelerators may be Nvidia® GPUs, which may be connected to each other and to one or more CPUs by NVLink® connections and/or PCI-Express connections, as discussed above.

Figure 2:
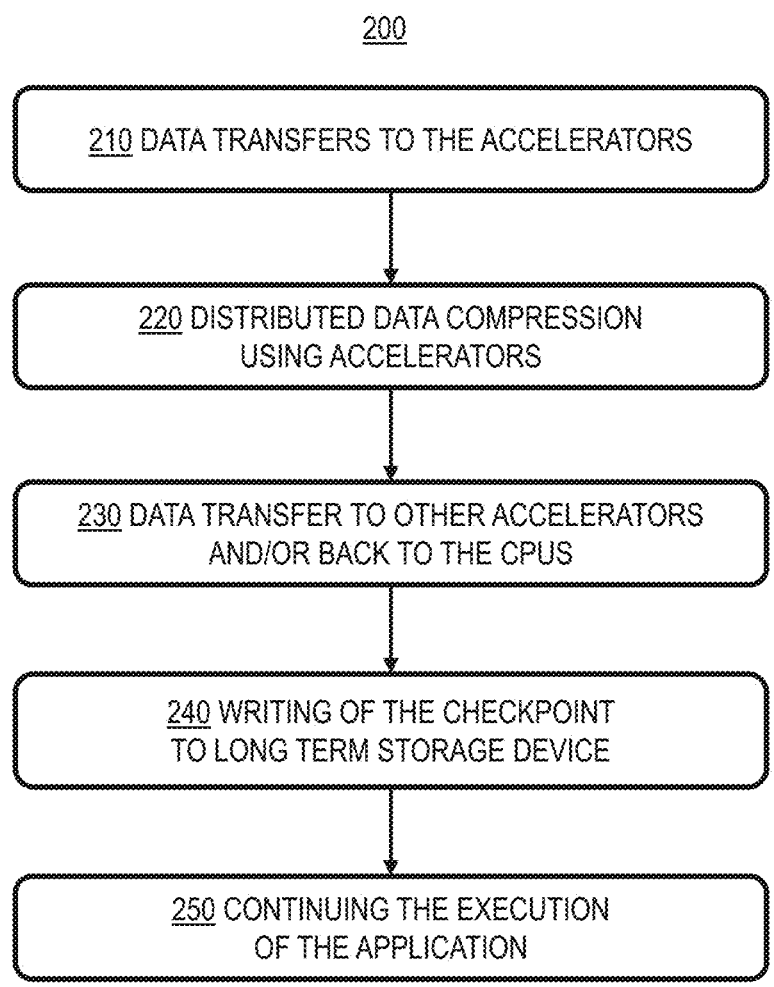
FIG. 2 is a flowchart showing an exemplary technique for execution of a checkpoint using accelerators for distributed data compression.

FIG. 2 is a flowchart showing an exemplary technique 200 for execution of a checkpoint using accelerators for distributed data compression. Step 210 involves data transfers to accelerators (e.g., from one or more CPUs). Step 220 involves distributed data compression using the accelerators. Step 230 involves data transfer from the accelerators to other accelerators (e.g., between GPUs) and/or back to the CPUs. Step 240 involves writing a checkpoint to a long-term storage device (e.g., a solid-state device and/or a hard disk). Step 250 involves resuming the execution of the application.

Figure 3:
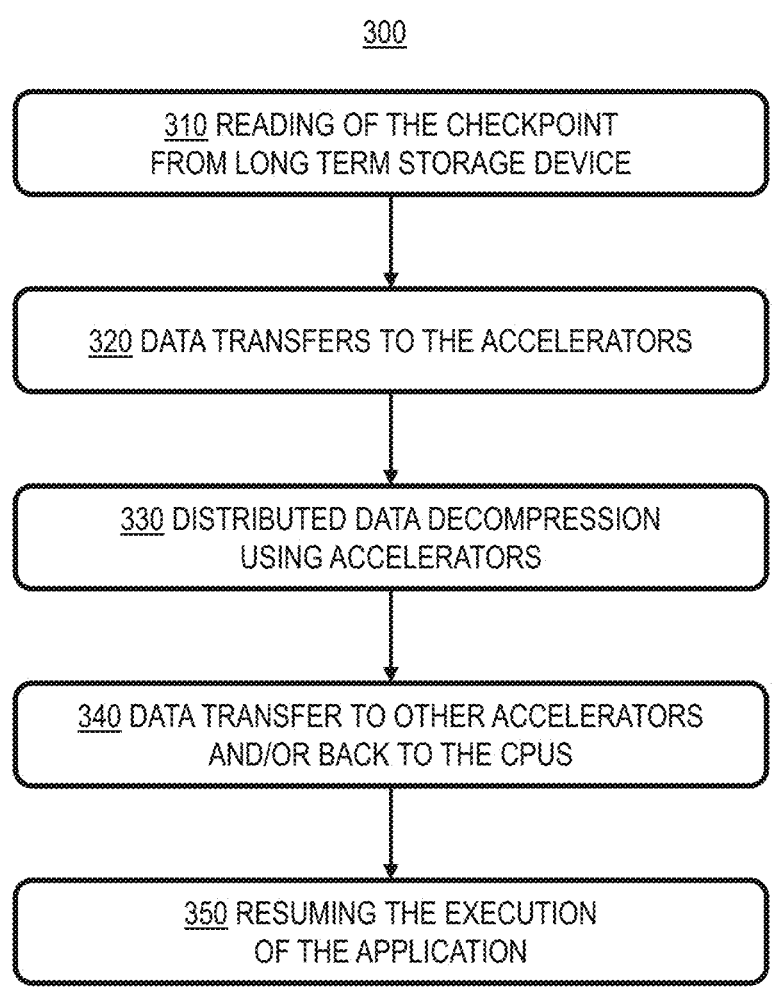
FIG. 3 is a flowchart showing an exemplary technique for execution of a restart using accelerators for distributed data decompression.

FIG. 3 is a flowchart showing an exemplary technique 300 for execution of a restart using accelerators for distributed data decompression. Step 310 involves reading a checkpoint from a long-term storage device (e.g., a solid-state device and/or a hard disk). Step 320 involves data transfers to accelerators (e.g., from one or more CPUs). Step 330 involves distributed data decompression using the accelerators. Step 340 involves data transfer from the accelerators to other accelerators (e.g., between GPUs) and/or back to the CPUs. Step 350 involves resuming the execution of the application.

In an illustrative embodiment, a checkpoint (e.g., written in step 240 and/or read in step 310) may include the status of an entire application (executing on the CPU as well as the accelerators), rather than the status of individual tasks running on the accelerators. Furthermore, in an illustrative embodiment, accelerators can compress and/or decompress data coming from any number of tasks on CPUs and/or accelerators, which need not be local but rather could be located at any node of a machine. In an illustrative embodiment, techniques 200 and/or 300 may utilize the Berkeley Lab Checkpoint/Restart (BLCR) library.

Figure 4:
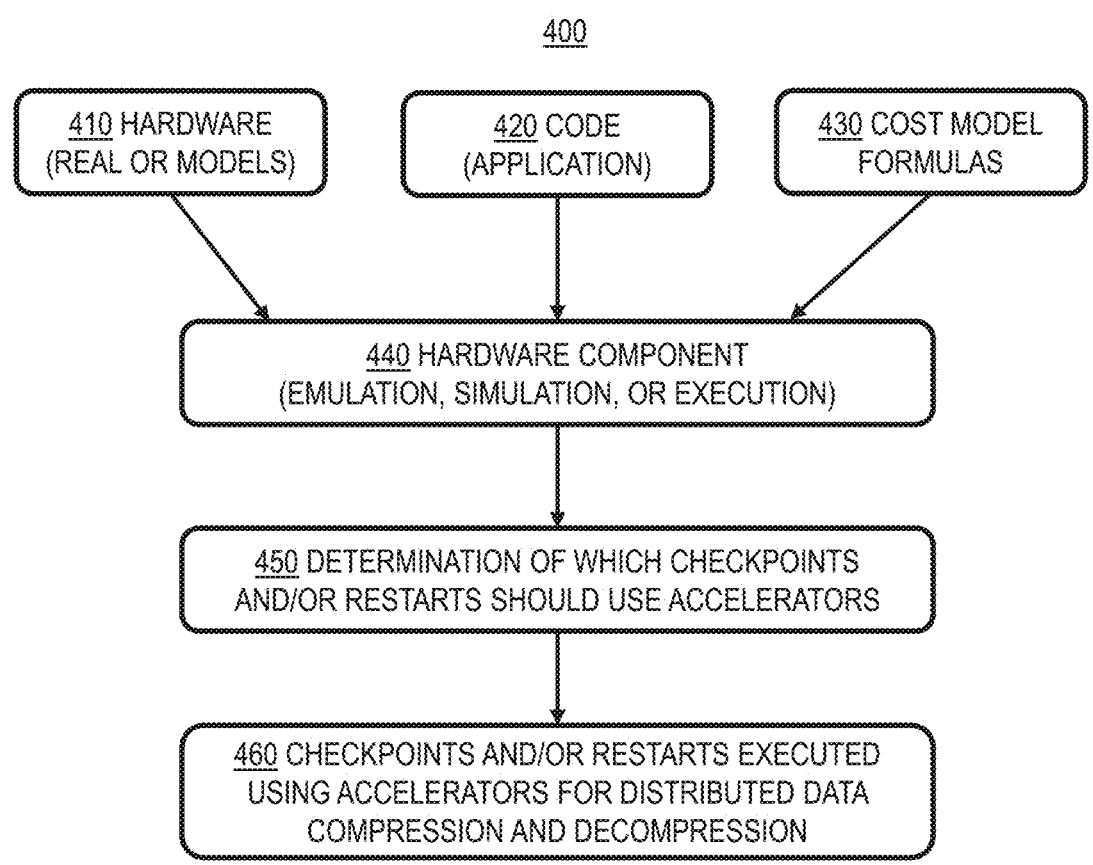
FIG. 4 is a combined block/flow diagram depicting aspects of an illustrative embodiment of the invention.

FIG. 4 is a combined block/flow diagram 400 showing aspects of an illustrative embodiment of the present invention. Hardware component 440 uses inputs 410, 420, and 430 to perform steps 450 and 460. Input 410 represents real hardware and/or hardware models, which may include an underlying architecture and/or network topology. Input 420 represents code for an application. Input 430 represents cost model formulas, e.g., for process migration to different nodes. Hardware component 440 may emulate, simulate, and/or execute application code 420 on real hardware or hardware models 430.

However, each application is different and will generate different types of checkpoints and/or restarts. Thus, in step 450, the hardware component 440 may apply cost model formulas 430 to determine whether to execute a given checkpoint and/or restart on accelerators rather than CPUs. If step 450 determines that a given checkpoint and/or restart should be executed on the accelerators, technique 200 may be applied for a checkpoint and/or technique 300 may be applied for a restart.

By way of example, if time is the only cost factor to be considered in step 450, then accelerators should be used for checkpointing where the total time to move the data from the CPUs to the GPUs 210, compress the data 220, move the data back from the GPUs to the CPUs 230, and write the data to the long-term storage device 240 is less than the time needed for the CPUs to write the uncompressed data to the long-term storage device. Factors that may be considered by a cost model formula 430 to determine whether or not accelerators should be used for a checkpoint may include: (1) the speed of the interconnecting network links, (2) the write bandwidth of the long-term storage device, (3) the number of accelerators used, (4) the efficiency of the compression code executed on the accelerators, and (5) the compression ratio achieved by the code on a specific checkpoint. A cost model formula 430 for use with a restart could incorporate additional and/or alternative cost parameters, such as the time necessary to recompile the code 420 on the hardware 410. Cost model formulas 430 may consider energy efficiency in addition to and/or instead of speed of execution.

Figure 5:
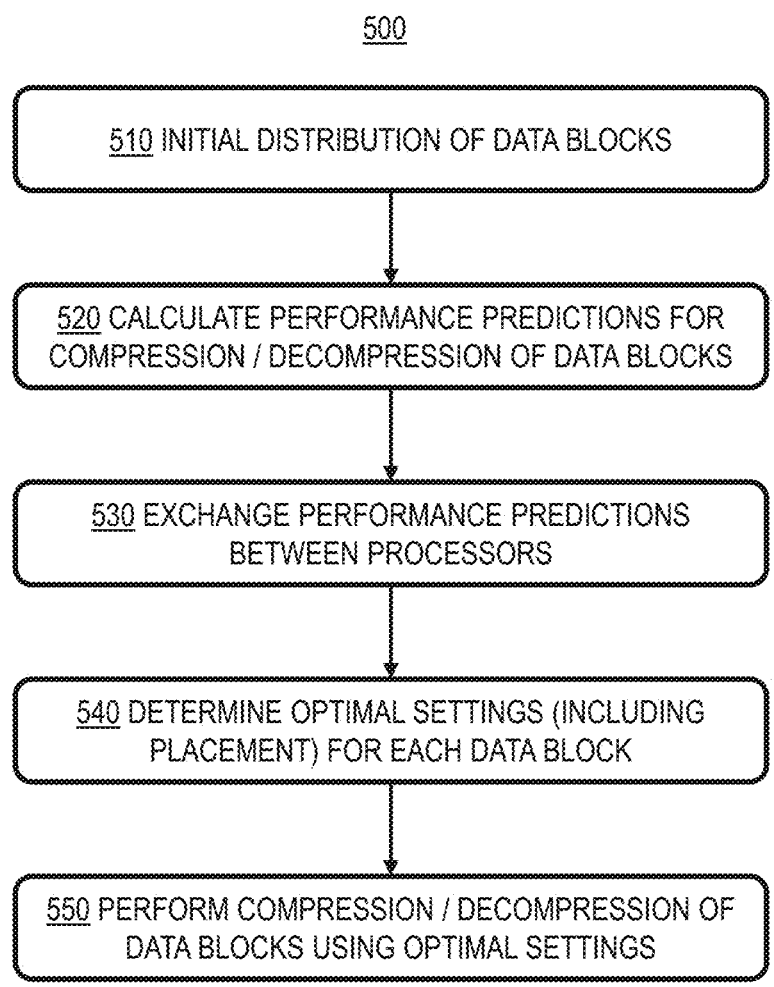
FIG. 5 is a simplified flowchart depicting aspects of an illustrative embodiment of the invention.

FIG. 5 is a flowchart showing an exemplary technique 500 in accordance with aspects of the present invention. Technique 500 begins in step 510, in which a data set (e.g., image) is partitioned into blocks. These blocks are distributed between the processing devices (e.g., CPU and GPUs) in accordance with an initial (likely naïve) distribution. In an illustrative embodiment, a grid may be used to initially divide an image into blocks of approximately similar size (e.g., a 3×3 grid used to divide an image into 9 blocks). However, data blocks are unique for each device. Thus, data blocks could have different sizes in different devices, or could even have different sizes for the same device. Partitioning a set of data into blocks may include, for example, binning the data, calculating the entropy for each bin, and then repeating using different sampling techniques if the entropy of the bins is not satisfactory. While data blocks may each comprise data which is contiguous in memory, this need not be the case: data layout in memory is particularly important for GPUs, and this can be accounted for by the sampling techniques. In step 510, the data blocks may then be distributed evenly (e.g., in a balanced manner) among respective GPUs, with some optionally being retained by the CPU(s). However, as further discussed below with regard to FIG. 6, the initial distribution of data blocks can be unbalanced, such that different processors (e.g., different GPUs) receive different numbers of blocks and/or different quantities of data.

Returning to FIG. 5, after data blocks are initially distributed to processors (e.g., CPUs and GPUs) in step 510, at least one performance prediction (e.g., processing speed and/or compression ratio) is calculated for each individual data block in step 520. Thus, for example, each processor (e.g., CPU 630 and GPUs 610 and 620) can calculate a performance prediction for each of the data blocks assigned thereto in step 510. Even assuming equal size, a data block with greater homogeneity (and lower entropy) may result in more efficient (e.g., less processing time and/or higher compression ratio) compression/decompression than a data block with greater entropy (and lower homogeneity). Besides entropy, the performance prediction for a given data block within a given processing device could depend on the architecture and settings of that device, such as the number of streaming multiprocessors (SMs) used within a given GPU.

In step 530, the performance predictions from step 520 can be exchanged between processors. For example, each GPU or CPU can exchange the predictions related to its data blacks with other GPUs and CPUs, in order to generate prediction views for the system which include the time necessary to move the data across the network (e.g., between CPUs and GPUs) considering the network's topology and state. The scope of the prediction views could range from local to total, with intermediate levels of abstractions (from a single GPU, to a cluster of GPUs, to hierarchical systems of GPUs, to the entire system). In some embodiments, each hardware component (e.g., CPU and GPU) has models of the architectures of its neighbor nodes, network topology, and local status of the system.

In step 540, the GPUs and/or CPUs decide whether each data block should be compressed or decompressed; and, if so, which processor should perform the compression/decompression and which settings (e.g., number of SMs, amount of memory, clock speed, and/or number of hardware registers per thread) should be used to optimize performance. Factors to be considered in the step may include the current status of the overall system, such as network traffic and potential unavailability of hardware components (e.g., some SMs within some GPUs). Determining the settings in step 540 could also include determining the optimal placement of each data block. Thus, it may be advantageous to move partitions of one or more data blocks across the network to other GPUs and/or CPUs before performing compression or decompression, for example, to balance the total workload to minimize the total time necessary to compress/decompress the data and write the compressed/decompressed blocks to storage.

An illustrative embodiment may involve the GPUs communicating amongst each other and reassigning workload therebetween in order to maintain consistency between processing times. For example, calculating the entropy of the block assigned to each GPU may indicate that a first GPU would require ten seconds to process a first block while a second GPU would require ten minutes to processing a second block of equal size but greater entropy than the first block. In such a circumstance, it may be desirable to reallocate workload (e.g., part of a block) from the first GPU to the second GPU such that each GPU would require approximately the same time (e.g., one minute) to process its respective portion of the data set (e.g., image).

Determining how to balance the workload in step 540 may include using cost functions that prioritize different factors to reflect trade-offs associated with various options (e.g., additional time lost in compression to achieve a greater compression ratio and/or time lost in moving data across the network). Thus, a combination of data movement and setting changes could be chosen to minimize the time necessary to compress/decompress all the data, the time necessary to write the results to the storage system, and/or the value of the cost function used for the whole system.

These techniques can be applied to both the compression/checkpoint phase discussed above with reference to FIG. 2, as well as the decompression/restart phase discussed above with reference to FIG. 3. With respect to the decompression/restart phase, by considering the status of the system prior to decompression (e.g., available GPUs, their architectures, network traffic, network topologies, compression ratio, original entropy levels of the compressed data blocks, etc.), the CPUs and the GPUs can decide how to distribute the compressed data blocks, which settings to use, and which decompression algorithms, to minimize the total decompression time and the time necessary to move the data across the network to allow a balanced whole system restart.

Finally, in step 550, the optimal placement from step 540 is implemented by moving blocks across the network between processors if necessary, and then compression/decompression of the data blocks is performed using the optimal settings determined in step 540. As discussed above with reference to FIGS. 2 and 3, further steps may include transferring the processed blocks to the CPU and/or to other GPUs, and the blocks may be written to a long-term storage device (e.g., hard drive or solid-state drive).

Figure 6:
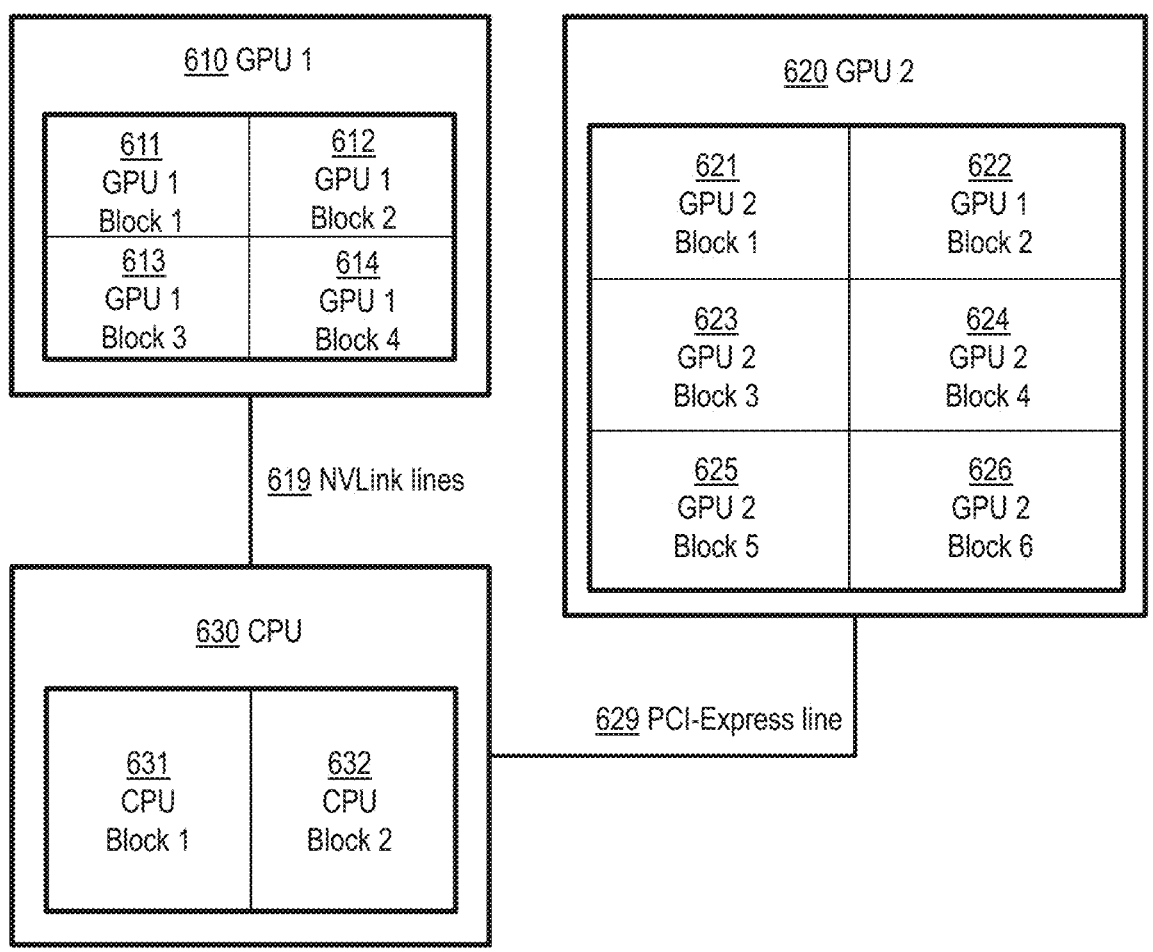
FIG. 6 is a simplified block diagram depicting aspects of an illustrative embodiment of the invention.

FIG. 6 shows a system 600, comprising a CPU 630 coupled to first and second GPUs 610 and 620, after initial distribution of data blocks (e.g., step 510 in FIG. 5). The GPUs 610 and 620 could have different architecture. In the illustrative embodiment shown in FIG. 6, CPU 630 is coupled to first GPU 610 with a plurality (e.g., four) NvLink® line 619, while CPU 630 is coupled to second GPU 620 with a PCI-Express v.3 link 629. As noted above, NvLink® connections (especially trunked connections) such as 619 offer substantially higher bandwidth than a PCI-Express link such as 629. Thus, the connection 619 between the CPU 630 and the first GPU 610 has much higher bandwidth than the connection 629 between the CPU 630 and the second GPU 620. Accordingly, system 600 shows an unbalanced initial distribution of data blocks (e.g., after step 510 in FIG. 5) in which CPU 630 has two data blocks (631, 632), first GPU 610 has four data blocks (611-614), and second GPU has six data blocks 620 (621-626).

As discussed above with reference to FIG. 6, it may be desirable to determine the optimal placement and settings for compression/decompression of each the data blocks 611-614, 621-626, 631 and 632 shown in FIG. 6. In an illustrative embodiment, the optimal placement and settings determined in steps 510-540 for the system 600 shown in FIG. 6 may be as follows:

Within CPU 630, data block 631 may be determined not to be worth compressing. This may be because of, for example, a high entropy level which would result in a low compression ratio (~1) such that the compressed data block would have a size similar to its original size. However, it may be beneficial to move data block 632 from CPU 630 to the first GPU 610 using 3 of the 4 available NvLink lines 619, and then to change the clock settings of GPU 610 in order to compress block 632 using the entire GPU (e.g., all of the SMs within GPU 610).

It may be determined that the first GPU 610 should compress all 4 of its initially-assigned data blocks 611-614 after compressing the data block 632 received from CPU 630. It may be determined that first GPU 610 should dedicate 4 SMs to the compression of data block 611, 1 SM to the compression of data block 612, and 1 SM to the compression of data blocks 613 and 614, such that blocks 613 and 614 will leverage the same SM concurrently. It may be further determined that data blocks 611-614 should be compressed without changing the clock settings for first GPU 610, although other settings could be changed if necessary, such as the number of hardware registers used per GPU thread.

It may be determined that data block 621 should be moved from the second GPU 620 to the first GPU 610 for compression, which may involve changing settings for GPU 610, then using the PCI-Express link 629 to move the block from second GPU 620 to CPU 630, and using one fast available line (e.g., 1 of the NVLink® lines 619) from CPU 630 to first GPU 610. Data blocks 622-626 may be compressed on the second GPU 620 without changing the settings for GPU 620 and allowing blocks 622-626 to concurrently use all of the SMs and 75% of the total capacity of their shared memories.

Even in a best-case scenario where a dedicated hardware compressor/decompressor is implemented on a state-of-the-art CPU (e.g., IBM® POWER chip), the maximum compression rate was less than 2 gigabytes per second (GB/s). By contrast, the same compression/decompression code implemented on a single Nvidia® P100 GPU could achieve compression speeds of about 15-16 GB/s, with decompression speeds of about 20-23 GB/s. Thus, the GPU compression speed is at least 7.5 times faster than CPU compression speed, even if the CPU includes dedicated on-chip hardware. Moreover, this ratio scales linearly with the number of GPUs per CPU, so that having two GPUs per CPU will result in compression speeds at least 15 times faster than a CPU alone. As discussed above, modern HPC systems often include many more than 2 GPUs per CPU.

An illustrative embodiment may incorporate algorithms optimized for compression/decompression of floating point numbers. For deep leaning applications, it may be advantageous to maximize the compression rates for floating point uniform distributions between [−1, +1] and [0, +1] because such distributions represent the most difficult cases to compress the weights of a neural network. The compression ratios generated by a normal Huffman compression code were between 1.3 and 1.8. Because these compression ratios were generated using a normal Huffman implementation, greater compression ratios are possible with more sophisticated algorithms.

An illustrative embodiment may additionally or alternatively incorporate algorithms optimized for compression/decompression of images and other graphic elements, which are used in many kinds of entertainment applications (including augmented reality/virtual reality). For images and graphic elements, highly parallel, lossless compression/decompression algorithms specifically designed for GPU architectures can produce compression ratios as high as 17.

Cloud nodes are becoming increasingly similar to HPC nodes: many cloud nodes now use GPUs and NVLink® interfaces. Thus, illustrative embodiments of the present invention can be used to compress/decompress data not only in HPC systems but also in cloud environments. For example, instead of using expensive solid-state drives (SSDs), it is possible to create redundancy for the compressed data (e.g., applying RAID techniques) and distributed the final result on the cloud. This saves money because there is no need to buy or maintain SSDs, while also reducing the total network congestion.

One or more embodiments of the invention, or elements thereof, can be implemented, at least in part, in the form of an apparatus including a memory and at least one processor that is coupled to the memory and operative to perform exemplary method steps.

Figure 7:
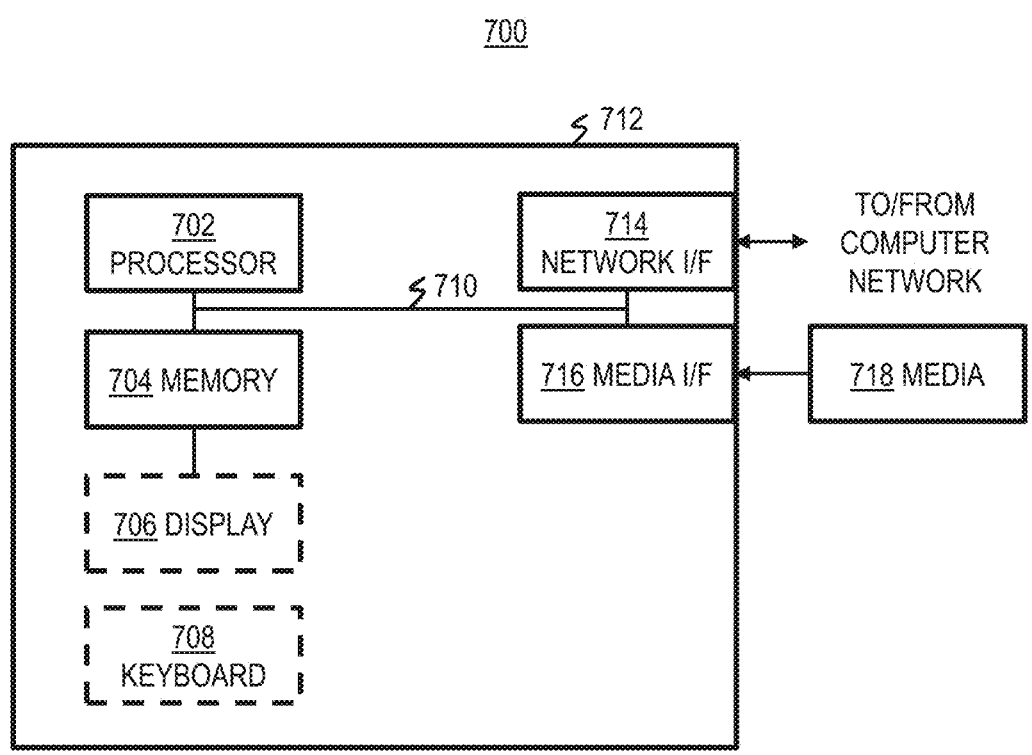
FIG. 7 shows a computer system that may be useful in implementing one or more aspects and/or elements of the invention.

One or more embodiments can make use of software running on a general purpose computer or workstation. With reference to FIG. 7, such an implementation might employ, for example, a processor 702, a memory 704, and an input/output interface formed, for example, by a display 706 and a keyboard 708. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 702, memory 704, and input/output interface such as display 706 and keyboard 708 can be interconnected, for example, via bus 710 as part of a data processing unit 712. Suitable interconnections, for example via bus 710, can also be provided to a network interface 714, such as a network card, which can be provided to interface with a computer network, and to a media interface 616, such as a diskette or CD-ROM drive, which can be provided to interface with media 718.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 702 coupled directly or indirectly to memory elements 704 through a system bus 710. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 708, displays 706, pointing devices, and the like) can be coupled to the system either directly (such as via bus 710) or through intervening I/O controllers (omitted for clarity).

Network adapters such as network interface 714 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 712 as shown in FIG. 7) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams or other figures and/or described herein. The method steps can then be carried out using the distinct software modules and/or sub-modules of the system, as described above, executing on one or more hardware processors 702. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for checkpointing and restarting an application executing at least in part on one or more central processing units coupled to one or more hardware accelerators, the method comprising:

checkpointing the application at least in part by:

deciding to perform distributed compression of application checkpoint data in response to an estimated time for compression of the application checkpoint using at least one of the one or more hardware accelerators being less than an estimated time for compression of the application checkpoint data using only the one or more central processing units;

transferring less than all of the application checkpoint data to the at least one of the one or more hardware accelerators;

performing distributed compression of the application checkpoint data in part using the at least one of the one or more hardware accelerators; and writing the compressed application checkpoint data to a storage device; and restarting the application at least in part by:

reading the compressed application checkpoint data from the storage device;

deciding to perform distributed decompression of application checkpoint data in response to an estimated time for decompression of the application checkpoint using at least one of the one or more hardware accelerators being less than an estimated time for decompression of the application checkpoint data using only the one or more central processing units;

transferring less than all of the compressed checkpoint data to the at least one of the one or more hardware accelerators; and performing distributed decompression of the application checkpoint data in part using the at least one of the one or more hardware accelerators.

2. The method of claim 1, wherein the one or more hardware accelerators comprise respective graphical processing units.

3. The method of claim 1, wherein checkpointing the application comprises transferring the checkpoint data of the application from the one or more central processing units to the one or more hardware accelerators.

4. The method of claim 3, wherein checkpointing the application further comprises transferring the compressed checkpoint data of the application from the one or more hardware accelerators back to the one or more central processing units prior to writing the compressed application checkpoint data to the storage device.

5. The method of claim 1, wherein the one or more central processing units are coupled to a plurality of hardware accelerators, and wherein checkpointing the application comprises transferring the application checkpoint data from at least a first one of the plurality of hardware accelerators to at least a second one of the plurality of hardware accelerators.

6. The method of claim 5, wherein checkpointing the application further comprises transferring the checkpoint data of the application from the one or more central processing units to at least the first one of the plurality of hardware accelerators.

7. The method of claim 5, wherein checkpointing the application further comprises transferring the compressed checkpoint data of the application from at least the second one of the plurality of hardware accelerators to the one or more central processing units prior to writing the compressed application checkpoint data to the storage device.

8. The method of claim 1, wherein the one or more central processing units are coupled to a plurality of hardware accelerators, and wherein restarting the application comprises transferring the compressed application checkpoint data from at least the first one of the plurality of hardware accelerators to at least the second one of the plurality of hardware accelerators.

9. The method of claim 8, wherein restarting the application further comprises:
transferring the compressed checkpoint data of the application from the one or more central processing units to at least the first one of the plurality of hardware accelerators, and transferring the application checkpoint data from at least the second one of the plurality of hardware accelerators back to the one or more central processing units.

10. A method for checkpointing and restarting an application executing at least in part on one or more central processing units coupled to one or more hardware accelerators, the method comprising:
checkpointing the application at least in part by:
deciding to perform distributed compression of the application checkpoint data at least in part using the one or more hardware accelerators;
transferring the application checkpoint data to the one or more hardware accelerators;
performing distributed compression of the application checkpoint data at least in part using the one or more hardware accelerators; and
writing the compressed application checkpoint data to a storage device; and
restarting the application at least in part by:
reading the compressed application checkpoint data from the storage device;
transferring at least a portion of the compressed checkpoint data to the one or more hardware accelerators; and
performing distributed decompression of the application checkpoint data at least in part using the one or more hardware accelerators,
wherein deciding to perform distributed compression of the application checkpoint data at least in part using the one or more hardware accelerators comprises estimating a time for the one or more central processing unit to write the application checkpoint data to the storage device without compressing the application checkpoint data.

11. A method for checkpointing and restarting an application executing at least in part on one or more central processing units coupled to one or more hardware accelerators, the method comprising:
deciding to perform distributed compression of the application checkpoint data at least in part using the one or more hardware accelerators;
transferring at least a portion of the application checkpoint data to the one or more hardware accelerators;
performing distributed compression of the application checkpoint data at least in part using the one or more hardware accelerators; and
writing the compressed application checkpoint data to a storage device; and
restarting the application at least in part by:
reading the compressed application checkpoint data from the storage device;
transferring at least a portion of the compressed checkpoint data to the one or more hardware accelerators; and
performing distributed decompression of the application checkpoint data at least in part using the one or more hardware accelerators,
wherein deciding to perform distributed compression of the application checkpoint data at least in part using the one or more hardware accelerators comprises estimating a time for the one or more central processing unit to compress the application checkpoint data and to write the compressed application checkpoint data to the storage device.

12. The method of claim 1, wherein deciding to perform distributed compression of the application checkpoint data is based at least in part on a connection speed between the one or more central processing units and the one or more hardware accelerators.

13. The method of claim 1, wherein deciding to perform distributed compression of the application checkpoint data is based at least in part on how many hardware accelerators are coupled to the one or more central processing units.

14. The method of claim 1, wherein restarting the application further comprises determining whether to perform distributed decompression of the application checkpoint data at least in part using the one or more hardware accelerators prior to transferring the application checkpoint data to the one or more hardware accelerators.

15. The method of claim 14, wherein determining whether to perform distributed decompression of the application checkpoint data at least in part using the one or more hardware accelerators comprises estimating a time for the one or more central processing unit to read the compressed application checkpoint data to the storage device and to decompress the application checkpoint data.

16. The method of claim 1, wherein at least one of the one or more hardware accelerators is located in a different node than at least one of the one or more central processing units.

17. The method of claim 1, wherein the checkpoint data for the application comprises data for at least a first task executing at least in part on at least one of the one or more central processing units and data for at least a second task executing at least in part on at least one of the one or more hardware accelerators.

18. The method of claim 17, wherein the at least one of the one or more hardware accelerators executing at least the second task is located in a different node than the at least one of the one or more central processing units executing at least the first task.

19. An apparatus comprising:
one or more central processing units; and
one or more hardware accelerators, the apparatus being operative:
to checkpoint an application executing at least in part on the one or more central processing units by:
deciding to perform distributed compression of application checkpoint data in response to an estimated time for compression of the application checkpoint using at least one of the one or more hardware accelerators being less than an estimated time for compression of the application checkpoint data using only the one or more central processing units;
transferring less than all of the application checkpoint data to at least one of the one or more hardware accelerators;
performing distributed compression of the application checkpoint data in part using the at least one of the one or more hardware accelerators; and
writing the compressed application checkpoint data to a storage device; and
to restart the application at least in part by:
reading the compressed application checkpoint data from the storage device;

deciding to perform distributed decompression of application checkpoint data in response to an estimated time for decompression of the application checkpoint using at least one of the one or more hardware accelerators being less than an estimated time for decompression of the application checkpoint data using only the one or more central processing units;

transferring less than all of the compressed checkpoint data to at least one of the one or more hardware accelerators; and performing distributed decompression of the application checkpoint data in part using the at least one of the one or more hardware accelerators.

20. A computer program product comprising a non-transitory machine-readable storage medium having machine-readable program code embodied therewith, said machine-readable program code comprising machine-readable program code configured:

to checkpoint an application executing at least in part on one or more central processing units by:

deciding to perform distributed compression of application checkpoint data in response to an estimated time for compression of the application checkpoint using at least one of one or more hardware accelerators being less than an estimated time for compression of the application checkpoint data using only the one or more central processing units;

transferring less than all of the application checkpoint data from the one or more central processing units to at least one of the one or more hardware accelerators;

performing distributed compression of the application checkpoint data at least in part using the at least one of the one or more hardware accelerators; and writing the compressed application checkpoint data to the storage medium; and to restart the application at least in part by:

reading the compressed application checkpoint data from the storage medium;

deciding to perform distributed decompression of application checkpoint data in response to an estimated time for decompression of the application checkpoint using at least one of the one or more hardware accelerators being less than an estimated time for decompression of the application checkpoint data using only the one or more central processing units;

transferring less than all of the compressed application checkpoint data to at least one of the one or more hardware accelerators; and performing distributed decompression of the application checkpoint data at least in part using the at least one of the one or more hardware accelerators.

\* \* \* \* \*